US007123051B1

(12) United States Patent
Lee et al.

(10) Patent No.: US 7,123,051 B1
(45) Date of Patent: Oct. 17, 2006

(54) SOFT CORE CONTROL OF DEDICATED MEMORY INTERFACE HARDWARE IN A PROGRAMMABLE LOGIC DEVICE

(75) Inventors: Andy L. Lee, San Jose, CA (US); Brian D. Johnson, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/873,668

(22) Filed: Jun. 21, 2004

(51) Int. Cl.
H03K 19/177 (2006.01)
(52) U.S. Cl. .......................... 326/40; 326/37; 365/233
(58) Field of Classification Search ................. 326/40
See application file for complete search history.

(56) References Cited

U.S. PATENT DOCUMENTS

| | | |
|---|---|---|
| 5,223,755 A | 6/1993 | Richley |
| 5,555,214 A | 9/1996 | Sung et al. |
| 5,633,830 A | 5/1997 | Sung et al. |
| 5,764,080 A | 6/1998 | Huang et al. |
| 5,802,540 A | 9/1998 | Sung et al. |
| 5,828,229 A | 10/1998 | Cliff et al. |
| 5,970,255 A | 10/1999 | Tran et al. |
| 5,978,281 A | 11/1999 | Anand et al. |
| 6,002,282 A | 12/1999 | Alfke |
| 6,011,744 A | 1/2000 | Sample et al. |
| 6,044,122 A | 3/2000 | Ellersick et al. |
| 6,049,255 A | 4/2000 | Hagberg et al. |
| 6,061,292 A | 5/2000 | Su et al. |
| 6,100,713 A | 8/2000 | Kalb et al. |
| 6,128,692 A | 10/2000 | Sung et al. |
| 6,140,854 A | 10/2000 | Coddington et al. |
| 6,147,520 A | 11/2000 | Kothandaraman et al. |
| 6,150,863 A | 11/2000 | Conn et al. |
| 6,157,690 A | 12/2000 | Yoneda |
| 6,178,212 B1 | 1/2001 | Akashi |
| 6,212,113 B1 | 4/2001 | Maeda |
| 6,212,127 B1 | 4/2001 | Funaba et al. |
| 6,236,231 B1 | 5/2001 | Nguyen et al. |
| 6,252,419 B1 | 6/2001 | Sung et al. |
| 6,269,051 B1 | 7/2001 | Funaba et al. |
| 6,279,073 B1 | 8/2001 | McCracken et al. |
| 6,295,245 B1 | 9/2001 | Tomita et al. |
| 6,316,980 B1 | 11/2001 | Vogt et al. |
| 6,342,796 B1 | 1/2002 | Jung |
| 6,346,843 B1 | 2/2002 | Takahashi |
| 6,351,165 B1 | 2/2002 | Gregorian et al. |
| 6,351,166 B1 | 2/2002 | Hashimoto |
| 6,356,509 B1 | 3/2002 | Abdel-Hafeez et al. |

(Continued)

OTHER PUBLICATIONS

U.S. Appl. No. 10/037,861, filed Jan. 2, 2002, Chong, et al.

(Continued)

Primary Examiner—James H. Cho
(74) Attorney, Agent, or Firm—Townsend and Townsend and Crew LLP

(57) ABSTRACT

The present invention is directed to a soft core logic circuit implemented in a PLD that estimates an appropriate phase delay and applies the phase shift to a read strobe signal to align its rising and falling edges at the center of a data sampling window associated with a group of read data signals. The soft core logic circuit dynamically determines an appropriate phase-shift value for the read strobe signal and adjusts the phase-shift to accommodate the environmental changes. The soft core logic circuit also introduces into the PLD various intermediate signals from a phase-shift estimator and a programmable phase delay chain.

39 Claims, 5 Drawing Sheets

U.S. PATENT DOCUMENTS

| | | |
|---|---|---|
| 6,400,197 B1 | 6/2002 | Lai et al. |
| 6,442,102 B1 | 8/2002 | Borkenhagen et al. |
| 6,445,642 B1 | 9/2002 | Murakami et al. |
| 6,466,491 B1 | 10/2002 | Yanagawa |
| 6,472,904 B1 | 10/2002 | Andrews et al. |
| 6,492,852 B1 | 12/2002 | Fiscus |
| 6,504,790 B1 | 1/2003 | Wolford |
| 6,509,776 B1 | 1/2003 | Kobayashi et al. |
| 6,525,565 B1 | 2/2003 | Young et al. |
| 6,525,585 B1 | 2/2003 | Lida et al. |
| 6,570,944 B1 | 5/2003 | Best et al. |
| 6,577,694 B1 | 6/2003 | Meghelli |
| 6,690,201 B1 | 2/2004 | Simking et al. |
| 6,798,241 B1 | 9/2004 | Bauer et al. |
| 6,806,733 B1 * | 10/2004 | Pan et al. .................... 326/41 |
| 6,816,991 B1 | 11/2004 | Sanghani |
| 6,864,710 B1 | 3/2005 | Lacey et al. |
| 6,864,715 B1 | 3/2005 | Bauer et al. |
| 6,940,768 B1 * | 9/2005 | Dahlberg et al. ........... 365/201 |
| 6,946,872 B1 | 9/2005 | Pan et al. |

OTHER PUBLICATIONS

U.S. Appl. No. 10/799,408, filed Mar. 12, 2004, Chong, et al.
U.S. Appl. No. 10/799,409, filed Mar. 12, 2004, Johnson.

* cited by examiner

SOFT CORE CONTROL OF DEDICATED MEMORY INTERFACE HARDWARE IN A PROGRAMMABLE LOGIC DEVICE

The present invention relates generally to memory interface circuitry and more particularly to a soft core logic circuit implemented in a programmable logic device that controls the operation of a programmable phase delay circuit.

CROSS-REFERENCE TO RELATED APPLICATIONS

"Calibration of memory interface circuitry," filed concurrently herewith and incorporated by reference herein.

BACKGROUND OF THE INVENTION

The accuracy and reliability of data transmission between different electronic devices are important concerns in integrated circuit (IC) design. FIG. 1A illustrates a typical data transmission system 100 that involves two commonly used electronic devices, a high-performance memory device 110 and a programmable logic device (PLD) 120. To better interface with the memory device 110, the PLD 120 implements within itself a memory interface controller 130, specifically responsible for receiving/sending data from/to the memory device 110. To synchronize the operation of the memory device 110 and the controller 130, an off-chip oscillator 140 generates a reference clock signal, RefCLK, and passes it to the memory interface controller 130 and the memory device 110.

Typically, the memory device 110 and the PLD 120 are connected by multiple data groups 150. Each data group 150 includes a number of channels carrying a plurality of data signals (DQ) and one channel carrying a data strobe signal (DQS). DQS is a special signal that samples the corresponding data signals in the same data group at an electronic device's input/output (IO) interface, e.g., the memory interface controller 130. A data sampling scheme in which DQ is sampled once per DQS cycle, e.g., at its rising edge, is referred to as single-data-rate (SDR) sampling, while a data sampling scheme in which DQ is sampled multiple times per DQS cycle is called multiple-data-rate (MDR) sampling. The most common MDR sampling is the double-data-rate (DDR) sampling in which DQ is sampled twice per DQS cycle, once on the rising edge and once on the falling edge of DQS, both of which are referred to as DQS's data sampling edges.

The most significant advantage of a DDR-based device is that it doubles its I/O throughput when compared with an SDR-based device operating at the same frequency. For convenience, data arriving at the PLD 120 from the memory device 110 is called "read data" and data leaving for the memory device 110 from the PLD 120 is called "write data". Accordingly, the data strobe signal associated with the read data (or write data) is referred to as the read strobe signal (or write strobe signal).

Most memory chip standards provide that a read strobe signal be edge-aligned with a set of read data signals. In other words, there is no phase shift between the two types of signals when they leave a memory device and arrive at another device's I/O interface. However, such an arrangement is not preferred for data sampling accuracy. To capture the read data signals accurately, it is preferred that the edge of the read strobe signal arrive after the edge of the read data signals. Conventionally, a dedicated phase delay circuit, standalone from or incorporated into the memory interface controller 130, is employed to produce a desired phase shift, e.g., 90°, on the read strobe signal so that the read strobe signal is center-aligned with the read data signals.

FIG. 1B schematically illustrates a typical DDR sampling scheme that can be applied to a memory interface circuit. Initially, a strobe signal (DQS) is edge-aligned with a data signal (DQ) when they reach the interface circuit. The strobe signal is then delayed by a particular phase-shift value $\Phi_{shift}$ so as to shift each of its data sampling edges to approximately the center of a data sampling window $W_{sampling}$ associated with each data bit of the data signal and thereby prevent data sampling errors.

In reality, the read data signals and the read strobe signal are not exactly edge-aligned when they arrive at a device's I/O interface due to various off-chip and on-chip skewing factors, such as routing mismatches between the read data signal and the read strobe signal, rise/fall delay mismatches between the read data signal and the read strobe signal, and power noise, etc. Therefore, a fixed phase delay, e.g., 90°, generated by the dedicated phase delay circuit may not center-align the read strobe signal with the read data signals. Meanwhile, the dedicated phase delay circuit itself usually does not have any control mechanism for its user to adjust the circuit's output. On the other hand, because of the advance of semiconductor technology, the operating frequency of a memory device keeps increasing with the result that the time period allocated to a single data bit keeps shrinking. Consequently, the dedicated 90° phase delay circuit and various data skewing factors may cause the read strobe signal to completely miss a desired data sampling window and produce errors in the sampled read data.

In general, there are two major steps in the reduction of sampling errors in the read data. The first step is to eliminate the source of each skewing factor as much as possible. For example, a careful board and package design can help to significantly reduce the routing mismatches between the read data signal and the read strobe signal. However, due to various technical reasons, it is impossible to completely remove the impact of the skewing factors. Consequently, the second step is to take into account in the determination of the phase shift in a device's I/O interface design the skewing factors that cannot be eliminated.

When a chip manufacturer releases a new model of memory devices, it typically provides a device specification characterizing the primary features of the new model. The device specification also lists the maximum data skews caused by different skewing factors this new model can tolerate, which represents the worst scenario that can ever happen to this model of memory devices, even though the data skews associated with a particular memory device in a specific application are often significantly smaller than what is described in the device specification.

Not knowing the data skews in a specific application, an IC designer has to assume that reliance on the device specification is a safe bet. An inevitable side effect originating from such an assumption is that it seriously reduces the dimension of the time window associated with a group of read data signals for data sampling. On the other hand, for a read strobe signal to sample the read data signals accurately, the data sampling window associated with the read data signals has to exceed a minimum duration. As a result, the only option for the IC designer to meet the two conflicting requirements is to sacrifice the application's performance by lowering its operating frequency such that even if the data skews are considered rigidly according to the memory device's specification, there is still sufficient time for reliable data sampling.

On the other hand, the actual data skews associated with a specific memory device in a particular application are often significantly smaller than the data in the device specification and it is not necessary to restrict the IC designer to the specification if there is an approach that takes into account the actual data skews automatically.

In view of the discussion above, it is highly desirable to have a memory interface device that places the edge of a read strobe signal exactly at the center of an actual data sampling window rather than shifting it by a predetermined value (e.g., 90°). It is further desirable to implement such a device in a programmable logic device to take advantage of its flexibility.

SUMMARY OF THE INVENTION

The present invention is directed to a soft core logic circuit implemented in a PLD that estimates an appropriate phase delay and applies the phase shift to a read strobe signal in order for its rising and falling edges to align at the center of a data sampling window associated with a group of read data signals.

In one aspect of the present invention, the soft core logic circuit implements a read-side calibration algorithm that is used for identifying an appropriate phase shift value which can optimally center-align the read strobe signal with the read data signals. Different embodiments presented herein demonstrate that the algorithm is able to not only identify the optimum phase-shift value that should be applied to the read strobe signal, but also adjust the value to counter-balance the environmental impact.

In another aspect of the present invention, the soft core logic circuit introduces the signals generated by a phase-shift estimator, e.g., a delay-locked loop circuit, and a programmable phase delay chain into the PLD. These signals are not only used for the read-side signal calibration, but also accessible to a user of the PLD for other important purposes, e.g., modularized system debugging.

In yet another aspect of the present invention, the soft core logic circuit implemented in the PLD can manage multiple groups of data signals at the same time and a user of the PLD even has the option to modify the soft core logic circuit based on the user-specific requirements.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

Like reference numerals refer to corresponding parts throughout the several views of the drawings.

DETAILED DESCRIPTION OF THE EMBODIMENTS

The present invention is directed to a soft core logic circuit implemented in a PLD that estimates an appropriate phase delay and applies the phase shift to a read strobe signal in order for its rising and falling edges to focus at the center of a data sampling window associated with a group of read data signals.

Figure 1A:
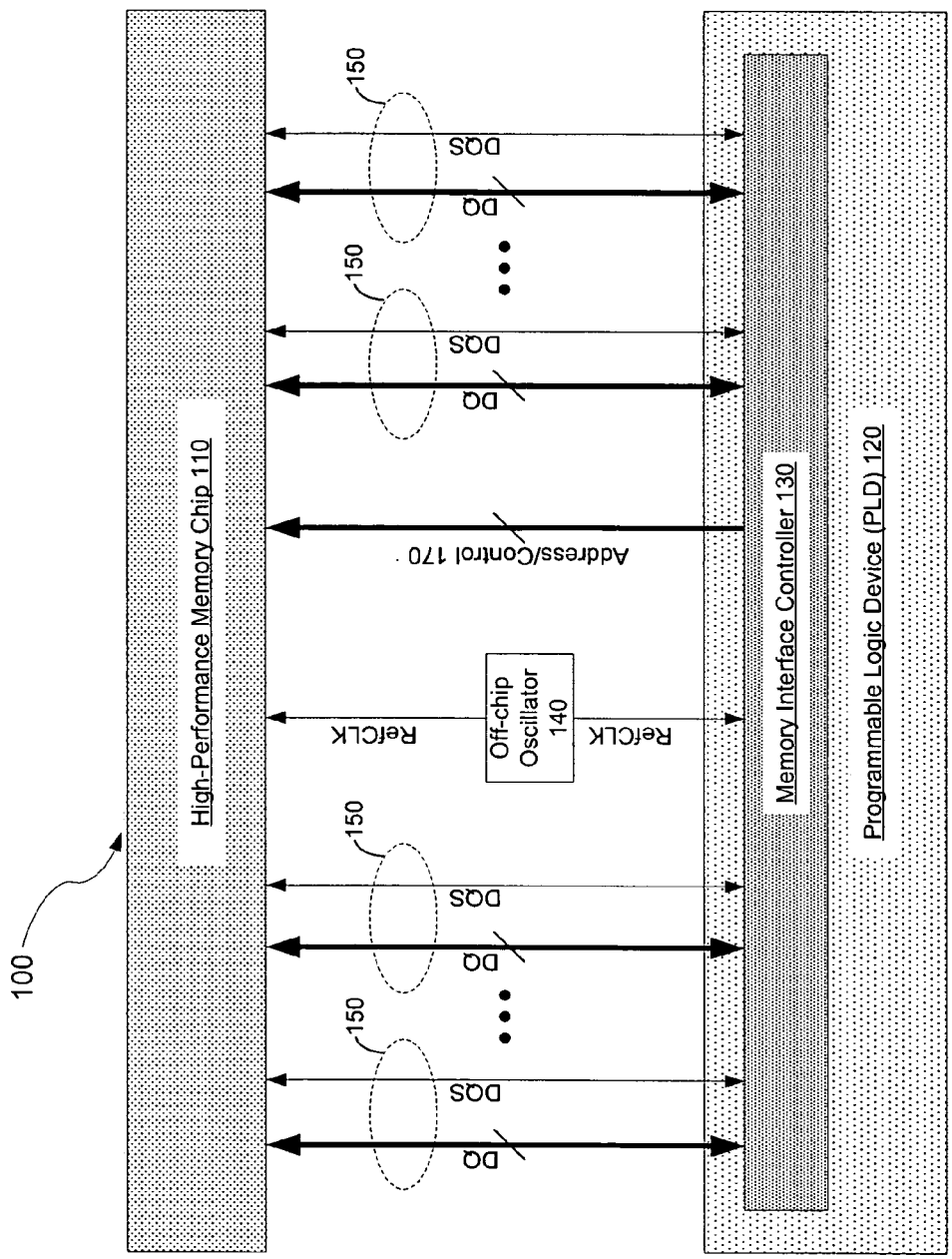
FIG. 1A illustrates a typical data transmission system that involves two commonly used devices, a high-performance memory device and a programmable logic device.
Figure 1B:
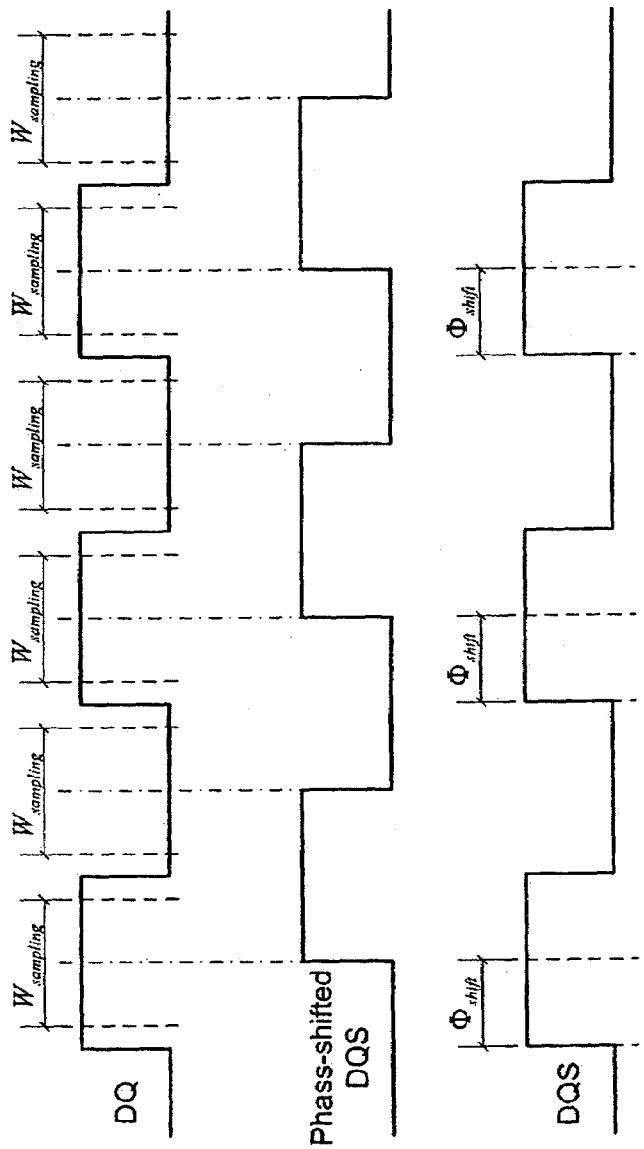
FIG. 1B schematically illustrates a typical DDR sampling scheme that can be applied to a memory interface circuit.
Figure 2:
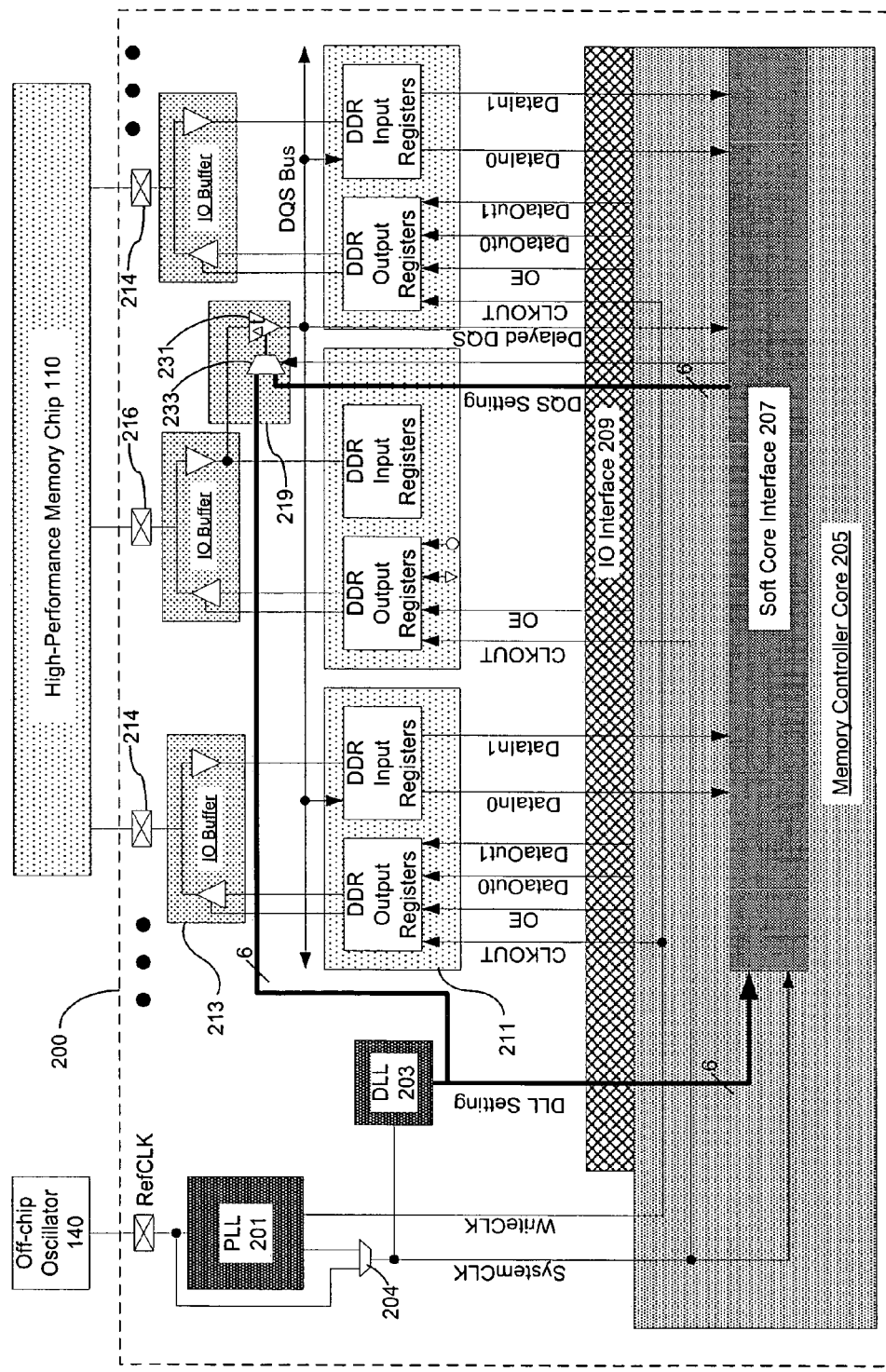
FIG. 2 is a schematic diagram of a read-side memory interface circuitry that incorporates a soft core logic circuit in accordance with the present invention.

FIG. 2 is a schematic diagram of a read-side memory interface circuitry 200 that incorporates a soft core interface 207 in accordance with the present invention. The memory circuitry 200 is implemented in a PLD that interfaces a high-performance memory chip 110. The memory interface circuitry 200 includes a plurality of DQ pins 214, DQS pins 216 and I/O buffers 213, an I/O interface 209 and a memory controller core 205. At each I/O buffer 213, the circuitry 200 receives either a read data signal coming through a DQ pin 214 or a read strobe signal coming through a DQS pin 216. The read strobe signal is used for sampling each of the read data signals in a corresponding I/O register block 211. However, prior to the data sampling, the read strobe signal is applied to a DQS delay chain 219 to be center-aligned with the read data signals to avoid generating errors during the data sampling.

To phase-shift a read strobe signal, the interface circuitry 200 inputs a reliable clock signal, e.g., the reference clock signal, RefCLK, from an off-chip oscillator 140. In one embodiment, this reference clock signal first routes through a phase-locked loop (PLL) circuit 201. The PLL circuit is usually used for generating a clock signal having the same frequency as the memory chip 110 if RefCLK's frequency is different from the memory chip's operating frequency. The PLL circuit can also filter out jitter associated with RefCLK and produce a cleaner clock signal. As shown below in connection with FIGS. 4A and 4B, less jitter also means more margins for accurate read data sampling. One output of PLL 201 provides a necessary write clock signal, WriteCLK, when the interface circuitry 200 sends data back to the memory chip 110 and the other provides the system clock signal, SystemCLK, for the rest of the interface circuitry 200.

In an alternative embodiment, the reference clock signal can be used directly as the system clock signal by the interface circuitry 200 without routing through PLL 201. Consequently, the interface circuitry 200 includes a multiplexer 204 that receives both the reference clock signal and the system clock signal at its input and outputs one of them to a delay-locked loop (DLL) circuit 203. The DLL 203 then generates a predetermined phase-shift specification, called a DLL setting. In one embodiment, the DLL setting is represented by 6 binary bits allowing the specification of any one of 64 settings, each corresponding to a specific phase shift value, e.g., 90° or 72°.

By contrast, the DLL setting generated by DLL 203 is submitted to a soft core interface 207 in one embodiment shown in FIG. 2. The soft core interface 207 implements a read-side calibration algorithm that is used for identifying an appropriate phase shift value which can optimally center-align the read strobe signal with the read data signals. The optimum phase shift value is expressed as a DQS setting, which may also be represented by 6 binary bits. The read-side calibration process (or the identification of the DQS setting) is typically an iterative process. The DLL setting is used as the initial estimate of the DQS setting. At the end of the read-side calibration process, the soft core interface 207 discovers the actual data sampling window of the read data signals and updates the DQS setting accordingly, which may be different from the DLL setting.

Figure 3:
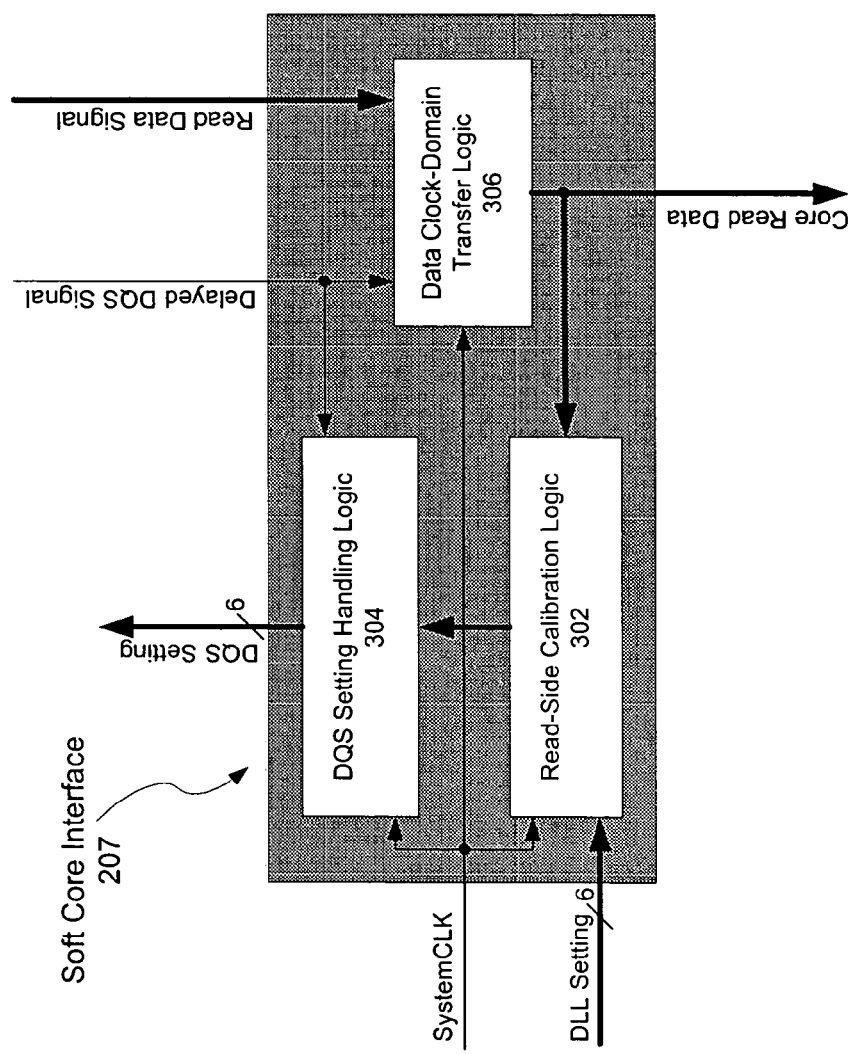
FIG. 3 is a schematic diagram illustrating the internal structure of a soft core interface in accordance with the present invention.

FIG. 3 is a schematic diagram illustrating the internal structure of the soft core interface 207 in accordance with the present invention. The soft core interface 207 includes a read-side calibration logic circuit 302, a DQS setting handling logic circuit 304 and a data clock-domain transfer logic circuit 306. In one embodiment, there is no dedicated hardware supporting any of the logic circuits in the soft core interface 207 and all logic circuits are implemented using programmable logic elements in the PLD itself. In another embodiment, at least some of the logic circuits, e.g., the read-side calibration logic circuit 302, may be implemented by dedicated hardware instead of using programmable logic elements in the PLD to achieve better performance. It will therefore be understood by one of ordinary skill in the art that the present invention covers any embodiment ranging from a purely PLD-based implementation to a purely dedicated hardware based implementation.

The read-side calibration logic circuit 302 receives the DLL setting generated by DLL 203 in FIG. 2. The read-side calibration logic circuit 302 executes a read-side calibration algorithm to generate a DQS setting that it passes to the DQS setting handling logic circuit 304. The DQS setting handling logic circuit 304 examines the delayed DQS signal coming from the DQS delay chain 219 to decide whether it is appropriate to transmit the DQS setting over to the DQS delay chain 219. This examination is made because both logic circuits 302 and 304 operate in accordance with the system clock signal, SystemCLK, while the DQS delay chain 219 operates in accordance with a different clock signal, the delayed DQS signal, which is out-of-phase with the system clock signal. The DQS delay chain 219 should only be updated by the DQS setting when it is not in the middle of transmitting the phase-shifted read strobe signal into the DQS bus to sample the read data signals.

In one embodiment, the DQS delay chain 219 is updated by the DQS setting when the system 100 incorporating the soft core interface 207 is powered on, since there is a period reserved for system self-examination during which there is no data transmission between the PLD 120 and the memory device 110. In another embodiment, the DQS delay chain 219 is updated whenever the memory interface circuitry 200 is not reading from the memory device 110, e.g., when the circuitry 200 writes data into the memory device 110 or when the circuitry 200 is idle. In another embodiment, the DQS delay chain 219 is updated on an as-needed basis. For example, the soft core interface 207 may include a parity error detection logic circuit. Whenever an error is detected, this detection logic circuit sends a request to the memory interface circuitry 200, requiring that the memory access to the device 110 be halted when the DQS delay chain is updated by the DQS setting. Alternatively, the soft core interface 207 may update the DQS delay chain on the fly if the update is fast enough. In yet another embodiment, the DQS delay chain is updated periodically, in time or in number of cycles, no matter whether there is any sampling error or not.

Similar to the delayed DQS signal, the read data signals coming into the data clock-domain transfer logic circuit 306 are also asynchronous to the system clock signal because of the phase delay associated with the delayed DQS signal. One purpose of logic circuit 306 is to transfer the read data signal from one clock domain, the delayed DQS signal, to the other clock domain, the system clock signal, which is shared by other core logic circuits in the PLD. Sometimes, the phase shift between the system clock signal and the delayed DQS signal is fixed, e.g., if the system 100 operates in a stable environment, then the read data can be transferred from the first domain to the second domain accurately through a carefully timed sampling and there is no need for the data clock-domain logic circuit 306. However, if the phase shift between the two clock domains is not fixed due to various on-chip and/or off-chip skewing factors, e.g., the system 100 operates in an environment of changing temperatures, a device like the data clock-domain logic circuit 306 that receives both the system clock signal and the delayed DQS signal as inputs becomes critical for the clock domain transfer. In one embodiment, the data clock-domain logic circuit 306 is implemented using a first-in-first-out (FIFO) scheme, i.e., the first read data signal coming into the data clock-domain logic circuit 306 being transferred first and then sent out as core read data.

The availability of signals like the DLL setting and the delayed DQS signal in the PLD as shown in FIG. 3 has other advantages. For example, it is possible for the designer of the PLD to test the DLL and the DQS delay chain separately rather than testing different parts as a whole. Such a modularized testing strategy makes it easier to pinpoint the real source of certain problems existing in the PLD. Being able to access these intermediate signals from a user's perspective also gives the user of the PLD an advantage in debugging hardware related problems when the PLD is implemented in an electronic system.

The read-side calibration logic circuit 302 is used for implementing the read-side calibration algorithm. As mentioned above, a read strobe signal entering the memory interface circuitry 200 may not be exactly edge-aligned with a group of read data signals. Actually, due to the various on-chip and off-chip skewing factors, the read data signals themselves may not be edge-aligned with each other when they enter the memory interface circuitry 200. As a result, a fixed phase shift represented by the DLL setting may fail to position the read strobe signal's rising and falling edges at the center of a data sampling window or even completely miss the data sampling window associated with the read data signals.

Figure 4A:
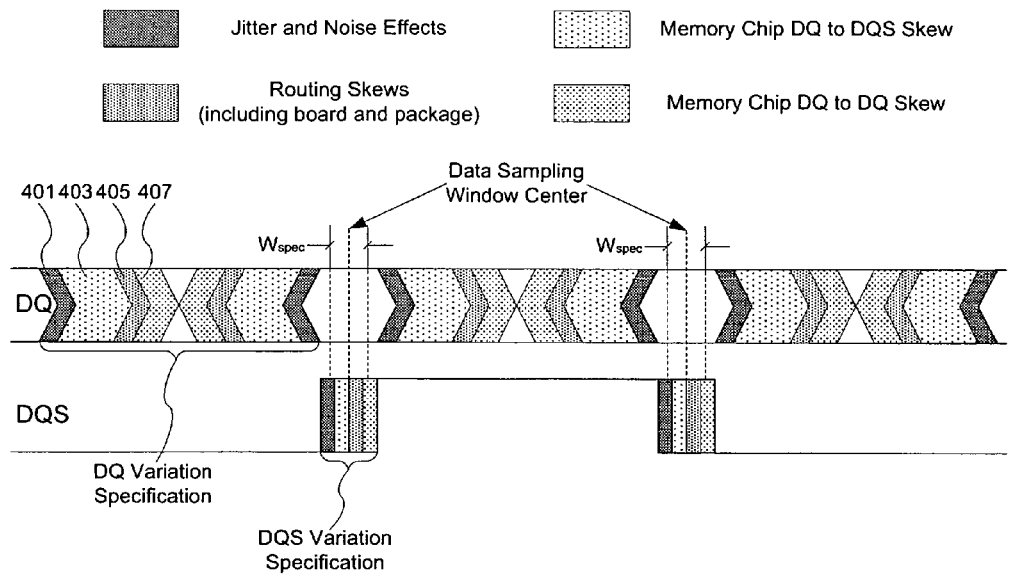
FIG. 4A schematically illustrates the impact of four typical data skewing factors on a data sampling window in accordance with a memory chip's specification.

FIG. 4A schematically illustrates the dilemma the designer may face using several data skewing factors when their impact on a read data signal (DQ) and a read strobe signal (DQS) is considered rigidly according to a memory chip's specification. Note that these skewing factors are chosen only for illustrative purposes, not intended to be inclusive. These four factors are:

the jitter and other noise effects 401, such as the varying transition periods between two adjacent signal cycles and the coupling effects from the power supply, etc.;

the memory chip DQ to DQS skew 403, e.g., a DQS signal may have a routing path slightly different from that of a DQ signal in the memory chip;

the routing skew 405 of different signals caused by the printed circuit board (PCB) routing and/or the package routing; and the memory chip DQ to DQ skew 407, e.g., two DQ signals may even have slightly different routing paths in the memory chip.

The accumulation of the data skews from these factors is represented by the DQ variation specification and DQS variation specification as shown in FIG. 4A. Because of the DQ variation specification, the width of the time window left for data sampling, $W_{spec}$, is so small that the boundary of the DQS variation specification may be even outside the time window. In other words, the rising or falling edges of the read strobe signal may fall outside the valid data sampling window, causing errors in the sampled read data. Even if the read strobe signal is phase-shifted such that its rising and falling edges are aligned with the center of the valid data sampling window, a slight environmental change, e.g., a variation in the temperature of the memory chip, may skew the read strobe signal's edges out of the data sampling window since the window is so narrow.

In summary, there are two serious issues with the conventional data sampling scheme: (1) it lacks necessary flexibility to deal with the data skewing factors by fixing the phase shift (e.g., 90°) of the read strobe signal; and (2) it significantly limits a designer by considering the skewing factors based on, e.g., a memory chip's specification which is often the worst scenario that could happen to a particular memory chip. The present invention proposes an alternative scheme, a read-side calibration (RSC) algorithm, that is both flexible and realistic when dealing with the various on-chip and off-chip skewing factors on a particular memory chip. The scheme is flexible because it does not apply a fixed phase shift to the read strobe signal. Instead, it manages to find the actual center of a data sampling window associated with a group of read data signals and shifts the read strobe signal accordingly. The scheme is realistic because it does not rigidly factor in every parameter in a specification provided, e.g., by a chip manufacturer. Instead, it only considers the actual impact of the various skewing factors on a particular memory chip. As a result, the width of the valid data sampling window associated with a group of read data signals increases substantially.

Figure 4B:
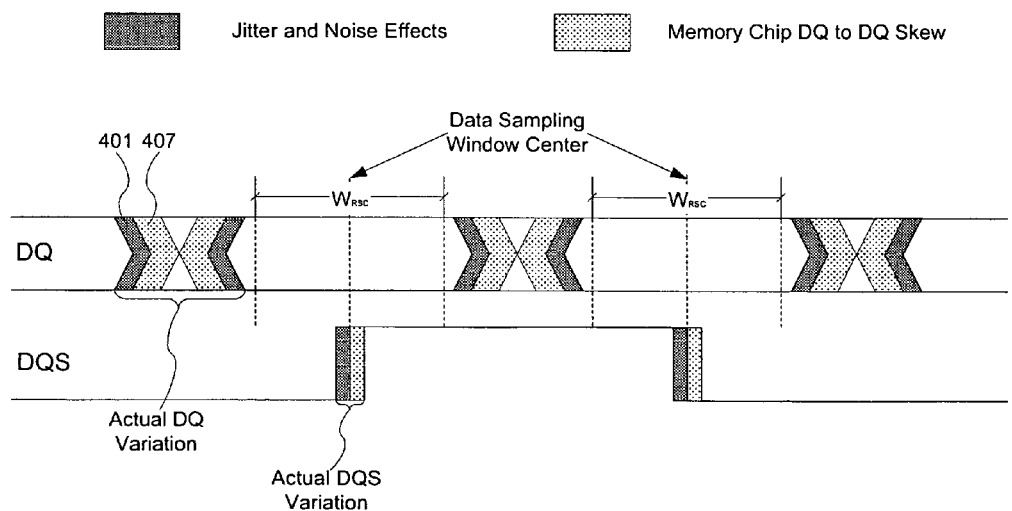
FIG. 4B schematically illustrates the impact of the four typical data skewing factors on the data sampling window in accordance with the read-side calibration algorithm of the present invention.

FIG. 4B schematically illustrates how the read-side calibration algorithm effectively reduces the adverse impacts of the various skewing factors on the valid data sampling window. First, the new scheme does not assume that the signals are edge-aligned when they enter the memory interface circuitry 200. Instead of applying a fixed 90° phase shift to the read strobe signal, the scheme dynamically detects the upper and lower bounds of the data sampling window of a group of read data signals. This detection automatically takes into account certain skewing factors, such as the memory chip DQ to DQS skew 403 and the routing skew 405, because the phase shift caused by these factors becomes part of the ultimate phase shift that will be applied to a read strobe signal. The two remaining skewing factors, the jitter and other noise effects 401 and the memory chip DQ to DQ skew 407, are considered according to their actual impact on the read data signals, not according to the specification which often significantly exaggerates the impact as demonstrated in FIG. 4A. As a result, the width of a valid data sampling window according to the new scheme, $W_{RSC}$, increases substantially, while the actual DQ and DQS variations drop significantly and there is little chance for the read strobe signal to miss the valid data sampling window.

It will be understood by one of ordinary skill in the art that the four factors shown in FIGS. 4A and 4B are primarily for illustrative purposes, that the impact of a skewing factor on the DQ or DQS signal may or may not be symmetric. Further, the representation of the impact of the skewing factors in FIGS. 4A and 4B may not be in proportion to their actual magnitude, which may vary dramatically depending on the type of a memory chip and the system in which it is used.

The read-side calibration logic circuit 302 takes advantage of the actual data sampling window that a particular memory device can afford and identifies an optimum phase-shift value represented by the DQS setting.

In a first embodiment, the read-side calibration logic circuit 302 applies a set of DQS settings to a DQS delay chain one by one, each DQS setting corresponding to a predetermined phase-shift value. The memory interface circuitry 200 samples a group of read data signals using a read strobe signal that is phase-shifted according to one particular setting to capture a calibration data pattern. Next, the memory interface circuitry 200 compares the calibration data pattern with a reference data pattern stored in the circuitry. As a result, the lower and upper bounds of the valid data sampling window are identified among the DQS settings such that any phase-shift value smaller than the lower bound and any one larger than the upper bound will cause at least one mismatch between the calibration data pattern and the reference data pattern. Based on the lower and upper bound phase-shift values, the memory interface circuitry defines an optimum phase-shift value as the average of the two boundary values and applies the optimum phase-shift value to the read strobe signal. This embodiment is referred to as the "full sweep" implementation of the read-side calibration algorithm.

In a second embodiment, read-side calibration logic circuit 302 uses the DLL setting input as the first estimate of the DQS setting to initiate a "smart search" for the optimum phase-shift value. For example, the read-side logic circuit 307 first slowly increases the phase-shift value associated with the DLL setting and conducts a series of data sampling experiments similar to what is described above in the first embodiment until the upper bound of the valid data sampling window is captured. Next, the read-side logic circuit 307 slowly decreases the phase-shift value associated with the DLL setting and identifies the lower bound of the data sampling window accordingly.

In a third embodiment, the read-side calibration logic circuit 302 assumes that the optimum phase-shift value is not fixed, but should adjust itself to accommodate the various environmental effects. Instead of locking a DQS delay chain to the optimum phase-shift value determined according to the previous two embodiments, the read-side calibration logic circuit 302 calculates a phase-shift difference between the optimum phase-shift value and the phase-shift value associated with the DLL setting. As a result, the optimum phase-shift value is conveniently expressed as the sum of the phase-shift difference and the phase-shift value associated with the DLL setting. The read-side calibration logic circuit 302, periodically or not, inputs the DLL setting and updates the DQS setting accordingly.

A significant advantage of the soft core interface 207 is that it is not a hardware implementation dedicated to any particular group of signals. Instead, the soft core interface 207 is capable of identifying a plurality of optimum phase-shift values for different groups and managing them simultaneously. Further, a user of the PLD hosting the soft core interface can customize the read-size calibration algorithm to his or her unique requirements if necessary.

The foregoing description, for purpose of explanation, has been made with reference to specific embodiments. However, the illustrative embodiments described above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An electronic device for interfacing a multiple-data-rate memory chip, comprising:
   a first logic circuit that receives a predetermined phase-shift setting from a phase-shift estimator and calculates an optimum phase-shift setting;
   a second logic circuit that applies the optimum phase-shift setting to a programmable phase delay chain; and
   a third logic circuit that receives a plurality of read data signals from the multiple-data-rate memory chip and passes the plurality of read data signals to the first logic circuit and one or more application circuits.

2. The electronic device of claim 1, wherein the first logic circuit determines a lower bound and an upper bound of a valid data sampling window associated with the plurality of read data signals.

3. The electronic device of claim 2, wherein the first logic circuit uses the predetermined phase-shift setting as the initial estimate of the optimum phase-shift setting.

4. The electronic device of claim 2, wherein the first logic circuit compares the plurality of read data signals with a reference data pattern.

5. The electronic device of claim 4, wherein the lower bound of the valid data sampling window corresponds to a phase-shift value such that any one smaller than the lower bound results in at least one mismatch between the plurality of read data signals and the reference data pattern.

6. The electronic device of claim 4, wherein the upper bound of the valid data sampling window corresponds to a phase-shift value such that any one larger than the upper bound results in at least one mismatch between the plurality of read data signals and the reference data pattern.

7. The electronic device of claim 4, wherein the optimum phase-shift setting corresponds to the average of the lower bound and the upper bound of the valid data sampling window.

8. The electronic device of claim 4, wherein a phase-shift difference is determined between the optimum phase-shift setting and the predetermined phase-shift setting.

9. The electronic device of claim 8, wherein the first logic circuit updates the optimum phase-shift setting according to the phase-shift difference and the predetermined phase-shift setting.

10. The electronic device of claim 1, wherein the second logic circuit receives a delayed read strobe signal from the programmable phase delay chain and determines if the programmable phase delay chain is idle or not.

11. The electronic device of claim 10, wherein the second logic circuit applies the optimum phase-shift setting to the programmable phase delay chain when it is idle.

12. The electronic device of claim 1, wherein the plurality of read data signals are sampled when they arrive at the third logic circuit by a read strobe signal phase-delayed by the programmable phase delay chain.

13. The electronic device of claim 12, wherein the plurality of read data signals are sampled when they arrive at the one or more application circuits by a system clock signal that is different from the phase-delayed read strobe signal.

14. The electronic device of claim 1, wherein the first, second and third logic circuits are operable by a system clock signal.

15. The electronic device of claim 1, wherein the first, second and third logic circuits are implemented in a programmable logic device.

16. The electronic device of claim 1, wherein the first, second and third logic circuits manage multiple groups of read data signals from the memory chip.

17. The electronic device of claim 1, wherein the phase-shift estimator is a delay-locked loop circuit.

18. A programmable logic device, comprising:
   a memory interface circuit that receives a plurality of data signals and a strobe signal from a memory device;
   the memory interface circuit further comprising:
      a logic module that generates a phase-shift setting;
      a programmable phase-shift circuit that receives the phase-shift setting and phase-shifts the strobe signal according to the phase-shift setting before the strobe signal is used for sampling the plurality of data signals,
   wherein the logic module further comprises;
      a phase-shift value generating circuit that generates a set of predetermined phase-shift values and selects an optimum phase-shift value therein;
      a phase-shift setting generating circuit that translates each of the predetermined phase-shift values and the optimum phase-shift value into a corresponding phase-shift setting and applies the phase-shift setting to the programmable phase-shift circuit; and
      a data clock-domain transfer circuit that transfers the sampled data signals from the programmable phase-shift circuit's clock domain to the logic module's clock domain.

19. The device of claim 18, wherein the phase-shift setting generating circuit monitors the phase-shifted strobe signal to apply a new phase-shift setting to the programmable phase-shift circuit when necessary.

20. The device of claim 18, wherein the phase-shift value generating circuit examines the sampled data signals to generate a new phase-shift value when there is any difference between the sampled data signals and a predetermined data pattern until the optimum phase-shift value is found when there is no difference between the sampled data signals and the predetermined data pattern.

21. The device of claim 18, wherein the memory device is embedded within the programmable logic device.

22. The device of claim 18, wherein the memory device is an external element that is electrically coupled to the programmable logic device through a printed circuit board.

23. The device of claim 18, wherein the logic module is implemented by a plurality of programmable logic elements.

24. An electronic system, comprising:
   a memory device;
   a programmable logic device for receiving a plurality of data signals from the memory device; and
   a memory control device for interfacing with both the memory device and the programmable logic device, the memory control device further comprising:
      a logic module for generating a phase-shift setting;
      a programmable phase-shift circuit for receiving the phase-shift setting from the logic module and phase-shifting a strobe signal according to the phase-shift setting before the strobe signal is used for sampling the plurality of data signals, wherein the logic module further comprises;
    a phase-shift value generating circuit generating a set of predetermined phase-shift values and selecting an optimum phase-shift value therein;
    a phase-shift setting generating circuit for translating each of the predetermined phase-shift values and the optimum phase-shift value into a corresponding phase-shift setting and applying the phase-shift setting to the programmable phase-shift circuit; and
    a data clock-domain transfer circuit for transferring the sampled data signals from the memory device's clock domain to the programmable logic device's clock domain.

25. The system of claim 24, wherein the phase-shift setting generating circuit monitors the phase-shifted strobe signal to apply a new phase-shift setting to the programmable phase-shift circuit when necessary.

26. The system of claim 24, wherein the phase-shift value generating circuit examines the sampled data signals to generate a new phase-shift value when there is any difference between the sampled data signals and a predetermined data pattern until the optimum phase-shift value is found when there is no difference between the sampled data signals and the predetermined data pattern.

27. An integrated circuit comprising:
    an double data rate input register having a data input and a clock input;
    a first-in-first-out memory having an input coupled to a data output of the double data rate input register;
    an input buffer coupled to receive a DQS signal on a first pad;
    a variable delay line having an input coupled to an output of the input buffer and providing a variable delay; and
    a control circuit coupled to the variable delay line to increment the variable delay from a first delay to a second delay in steps, and while incrementing the delay, to determine a first step where a first event occurs and to determine a second step where a second event occurs,
wherein after incrementing the variable delay line, a phase between a signal at the data input and a signal at the clock input of the double data rate input register is set based on the first step and the second step.

28. The integrated circuit of claim 27 wherein the control circuit provides a control signal comprising a plurality of bits to the variable delay line.

29. The integrated circuit of claim 28 wherein the phase between the signal at the data input and the signal at the clock input of the double data rate input register is set at least in part by averaging a first value of the control signal when the first event occurs and a second value of the control signal when the second event occurs.

30. The integrated circuit of claim 27 further comprising:
    a plurality of programmable logic elements configurable to implement user-defined logic functions.

31. The integrated circuit of claim 30 further comprising:
    a closed-loop clock circuit;
    a double data rate output register having inputs coupled to the plurality of programmable logic elements and a clock input coupled to an output of the closed-loop clock circuit.

32. The integrated circuit of claim 31 wherein the closed-loop clock circuit comprises a phase-locked loop.

33. The integrated circuit of claim 27 wherein the first event comprises receiving data without errors and the second event comprises receiving data with errors.

34. A method of receiving data at a memory interface comprising:
    receiving a data strobe signal;
    delaying the data strobe signal by each of a plurality of delays;
    determining a first delay for the data strobe signal where a first change in condition is detected;
    determining a second delay for the data strobe signal where a second change in condition is detected;
    using the first and second delays to set a third delay between a data signal at a data input of a double data rate input register and a signal at a clock input of the double data rate input register;
    receiving a data signal at the data input of the double data rate input register; and
    storing data signals from the double data rate input register in a first-in-first-out memory.

35. The method of claim 34 wherein the third delay is set at least in part by averaging the first and second delay.

36. The method of claim 35 wherein the first change in condition comprises a change from receiving data with errors to receiving data without errors, and the second change in condition comprises a change from receiving data without errors to receiving data with errors.

37. The method of claim 34 further comprising:
    providing data signals to a plurality of programmable logic circuits using the first-in-first-out memory, the plurality of programmable logic elements configurable to implement user-defined logic functions.

38. The method of claim 37 further comprising:
    receiving a clock signal;
    retiming the clock signal with a closed-loop clock circuit;
    providing data output signals to a double data rate output register with the plurality of programmable logic elements; and
    clocking the data output signals at the double data rate output register with the retimed clock signal.

39. The method of claim 38 wherein the closed-loop clock circuit comprises a phase-locked loop.

* * * * *